United States Patent [19]

Pouysegur et al.

[11] Patent Number: 5,576,660
[45] Date of Patent: Nov. 19, 1996

[54] BROADBAND PREDISTORTION LINEARIZER WITH AUTOMATIC TEMPERATURE COMPENSATION FOR MICROWAVE AMPLIFIERS

[75] Inventors: Michel Pouysegur, Noe; François Nicolas, St Orens de Gameville, both of France

[73] Assignee: Alcatel Espace, Nanterre Cedex, France

[21] Appl. No.: 435,660

[22] Filed: May 5, 1995

[30] Foreign Application Priority Data

May 11, 1994 [FR] France .................................. 94 05821

[51] Int. Cl.⁶ ................................ H03F 1/26; H03F 1/30
[52] U.S. Cl. ................................................ 330/149; 330/53
[58] Field of Search ........................... 330/53, 107, 149, 330/286, 289, 124 R

[56] References Cited

U.S. PATENT DOCUMENTS 5,227,736  7/1993  Tucker et al. .......................... 330/149
5,258,722  11/1993  Jeffers .................................... 330/149
5,291,148  3/1994  Reisner et al. ......................... 330/149

FOREIGN PATENT DOCUMENTS

0040127A1  11/1981  European Pat. Off. .

Primary Examiner—Steven Mottola
Attorney, Agent, or Firm—Sughrue, Mion, Zinn, Macpeak & Seas

[57] ABSTRACT

A predistortion linearizer for microwave power amplifiers has a linear channel and a non-linear channel. Both channels are made up of the same units. Each channel includes a variable phase-shifter, a variable attenuator and an amplifier. Each channel can further include a fixed attenuator. The two channels are coupled at their ends by couplers each introducing a phase-shift of 90° so that the total phase-shift is 180°. Because the components of the two channels are the same, any variations with the frequency or the amplitude of the signal or with the operating temperature cancel out. The linearizer has applications in telecommunications and in particular in multicarrier systems.

11 Claims, 1 Drawing Sheet

BROADBAND PREDISTORTION LINEARIZER WITH AUTOMATIC TEMPERATURE COMPENSATION FOR MICROWAVE AMPLIFIERS

BACKGROUND OF THE INVENTION

1. Field of the invention

The invention concerns telecommunication by means of electromagnetic waves and in particular microwave amplifier devices used in transmit and/or receive equipment in such telecommunication systems. To be more precise, the invention concerns a predistortion linearizer for microwave amplifiers intended to alleviate the effects of non-linearity due to different amplification conditions in the various operating regimes of the equipment.

2. Description of the prior art

The person skilled in the art knows that to operate efficiently an amplifier, especially a power amplifier, must operate near saturation, and hence the need for a linearizer. Close to saturation the linearity of the amplifier is strongly degraded compared to the linearity of the same amplifier used with signals of lower amplitude than those required for operation under saturated conditions.

A non-linearity correction device known as a linearizer can be used to increase the linear dynamic range of an amplifier without compromising the electrical efficiency achieved near saturation. There are three types of linearizers: the feedback type, the feed forward type and the predistortion type.

The feedback type linearizer is suitable for amplifiers operating at relatively low frequencies in which variations in the signal characteristics (and therefore in the linearity of the amplifier) are slower than the loop response time, i.e. the time between detection of a non-linearity and its correction. On the other hand, this configuration is very difficult to use for amplifying microwave signals, as it is too slow (compared to the signal frequency) for results to be satisfactory.

Thus for microwave signals it is preferable to use either a feed forward linearizer or a predistortion linearizer. The principle of operation is based on the extraction by a coupler of part of a signal before amplification which is then processed by various active and passive electronic components to produce a non-linear correction signal having the same non-linearity characteristics as the wanted signal to be corrected, but with the opposite phase. In a feed forward linearizer circuit adding this correction signal to the amplified wanted signal achieves the required linearity. On the other hand, a predistortion linearizer supplies a correction signal with the signal to be amplified at the input of the microwave power amplifier the non-linearity of which is to be corrected.

Various types of predistortion linearizer have already been designed. A first family of predistortion linearizers is described in U.S. Pat. No. 4,992,754, BLAUVELT et al., assigned to ORTEL Corp. (USA), for example. According to this document, the wanted signal is applied to a delay line and the correction signal is produced in a parallel branch of the circuit with the amplitude adjusted so that it is equal to that of the non-linearity of the amplified signal, the phase of the signal being varied so that it is in phase opposition to the wanted signal in the delay line. The wanted signal and the correction signal are added by means of a microwave coupler (power combiner) and are then fed to the input of the microwave power amplifier. The non-linearities at the output of the power amplifier stage are significantly reduced or even eliminated by this means.

Another type of predistortion linearizer is known from U.S. Pat. No. 4,068,186 SATO et al., assigned to KDD (Japan). This linearizer, shown schematically in FIG. 1, is designed to operate at high frequencies and to alleviate the non-linearity of a klystron or TWT (travelling wave tube) type amplifier. SATO et al. teach the use of a low-power TWT as a non-linearity generator. This type of amplifier introduces a slight time-delay of the amplified signal relative to the unamplified signal, due to the finite propagation speed of electrons in a vacuum. It is therefore necessary to include a delay line 3 in the corrector branch of the circuit to synchronize the non-linear and linear channel signals.

The signal to be amplified is applied to the input 1 of the SATO et al. linearizer, which is connected to a first amplitude-frequency characteristic corrector 10 the output of which is fed to a coupler (power divider) 2 which splits the signal into two parts fed to the inputs of respective transmission lines, a first of which includes a delay line 3 and the second of which includes a microwave amplifier 4 generating non-linear distortion, for example a low-power TWT. The fourth branch of the coupler 2 is terminated by a matched load 8. The coupler 2 conventionally introduces a phase shift $\theta$ between the two output signals. The coupler can be a 3 dB hybrid coupler, for example, in which case the phase shift is $\theta=\pi/2=90°$.

The main channel (or linear channel) includes a microwave amplifier 4 the operating point of which is chosen near saturation to generate non-linearities which depend on the power of the input signal. A variable attenuator 13 is provided at the output of the amplifier 4 so that the output level of the predistortion linearizer device can be varied without altering the gain of the amplifier 4.

In the SATO et al. disclosure the other (nonlinear) channel includes a phase-frequency characteristic corrector 9 in addition to the delay line 3. The signals from the two channels are applied to two inputs of a coupler (power combiner) 5 which adds them together (still with a phase shift $\theta$ between the two signals). This coupler can be a 3 dB hybrid coupler, for example, which introduces a further phase shift $\theta=\pi/2$. The fourth branch of the coupler 5 is terminated by a matched load 7. The signal obtained by adding the two signals at the two inputs is then fed to a second amplitude-frequency characteristic corrector 12. The wanted signal, complete with the predistortion, is then fed to the output 6 of the device from which it is fed to the input of a microwave power amplifier.

This prior art device therefore includes two nonlinear amplitude-frequency characteristic correctors 12 and 10 plus a phase-frequency characteristic corrector 9. Embodiments of such corrector units are described in the SATO et al. document, the disclosure of which is hereby incorporated by way of reference, constituting description of the prior art.

The non-linear characteristics of these units are added to those of the microwave amplifier 4. The transfer functions of all these units vary in a disparate manner with the signal frequency and amplitude and with the temperature of the components. The non-linear signal produced in this way is added to the wanted signal with the opposite phase to cancel the non-linearity of the microwave power amplifier (not shown), but cancellation is obtained only in relatively narrow frequency band, over a relatively narrow range of input power and at a given temperature.

A transfer function with gain and phase increasing with the input signal level can be obtained by varying the characteristics of the corrector units 9, 10, 12. This is usually the required response for linearizing a power TWT.

A transfer function with the gain increasing with the input signal level but the phase decreasing with the latter can be obtained by a different adjustment of the corrector units 9, 10, 12. This is the response required to linearize a solid state power amplifier.

Another broadband microwave linearizer is described in the article by A. M. KHILLA "Novel broadband linearizers and their application in power amplifiers for satellite transponders and ground stations", published in *Proceedings Second European Conference on Satellite Communications*, Liege, Belgium, 22–24 Oct. 1991, pp 229–234, published by ESA (European Space Agency), publication No SP-332, the content of which is hereby incorporated by way of reference, constituting a description of the prior art.

This document teaches the use of a predistortion circuit for linearizing a broadband amplifier of a Ku band satellite transponder. As in the SATO et al. document, the circuit has two branches connected at their ends by two 3 dB hybrid couplers, each introducing a phase-shift of 90°. It further teaches the use of equal electric lengths in the two branches, a configuration that is relatively rare in other predistortion circuits described in the literature.

The operating principle of predistortion linearizers as described in the prior art documents cited hereinabove can be used in microwave applications. Nevertheless, it has a number of major drawbacks which make it difficult to use.

A first drawback is inherent in the fact that the initial adjustments of the amplitude-frequency characteristic corrector circuits (10, 12) and the phase-frequency characteristic corrector circuit (9) are often difficult and time-consuming, and constitute a task which is even more complicated in the usual case in which the electrical lengths of the two channels are very different.

A second drawback results from the fact that the two channels comprise components of different kinds, with different responses to temperature variations; this causes variations in the characteristics of the corrector units and therefore in the overall transfer function of the device, these variations being highly temperature-sensitive.

A further drawback of the prior art devices is that the optimum bandwidth of the non-linearity corrector device is limited by the differences between or by different variations in the electrical lengths of the two channels, depending either on the frequency or the amplitude of the signals to be amplified or on the operating conditions and in particular the temperature.

An object of the invention is to alleviate the drawbacks of the prior art.

SUMMARY OF THE INVENTION

To this end, the invention proposes a predistortion linearizer for microwave amplifiers including:

an input divider having one input and two outputs with a relative phase-shift of 90° between said two outputs;

a linear first channel and a non-linear second channel, said linear and non-linear channels having substantially the same electrical length and comprising identical circuits; and an output combiner having two inputs and one output, with a relative phase-shift or 90° between said two inputs.

The divider is preferably a 3 dB hybrid coupler. The combiner is preferably a 3 dB hybrid coupler. The divider is preferably a branch-line coupler. The combiner is preferably a ring coupler.

The invention provides various technologies for fabricating the circuits of the linearizer, which can be implemented at least in part in the MMIC technology. The linearizer is preferably implemented at least in part in the MIC technology. The invention also consists in a microwave amplifier including a linearizer in any of the variants defined hereinabove.

The invention will be better understood and its various features and advantages will emerge from the following detailed description of one embodiment of the invention and from the appended drawings.

DETAILED DESCRIPTION OF THE PREFERRED EMBODIMENT

The figures are given by way of non-limiting example to illustrate the main features of the invention and its variants. Like reference numbers refer to like elements of both figures. Equivalent means can be substituted for the means shown in the figures without this departing from the scope of the invention.

Figure 1:
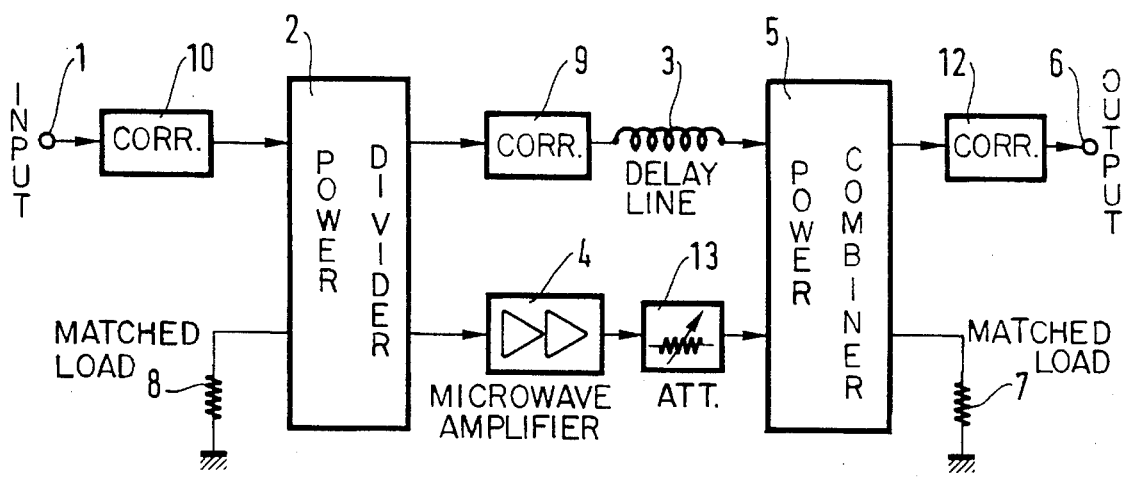
FIG. 1, already described, shows a prior art predistortion linearizer.
Figure 2:
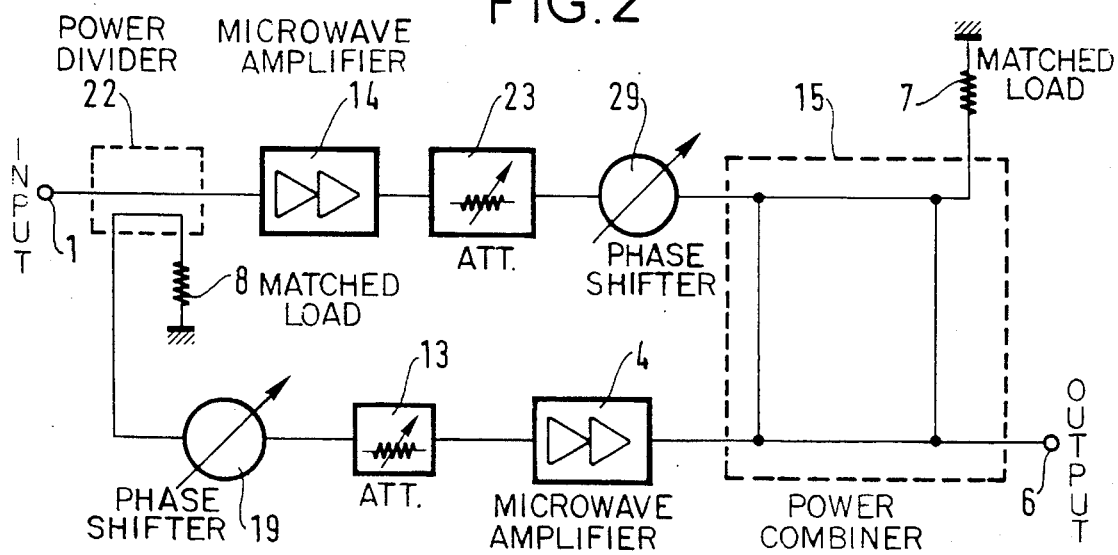
FIG. 2 is a diagrammatic representation of one embodiment of a predistortion linearizer of the invention.

FIG. 2 shows one embodiment of a linearizer of the invention. The diagram is similar in many ways to the FIG. 1 diagram showing the prior art. As in the preceding figure, the signal to be amplified is fed to the input 1 of the linearizer which is connected to the input of a coupler (power divider) 22 one branch of which is terminated by a matched load 8. The signal is thus divided into two parts applied to respective inputs of two transmission lines. The coupler (power divider) 22 conventionally introduces a phase-shift θ between the two signals fed from its outputs to the two transmission lines. The coupler 22 can be a 3 dB hybrid coupler, for example, which introduces a phase-shift θ=π/2 (=90°). In a preferred embodiment of the invention the coupler 22 can be a microstrip branch-line coupler, for example.

The first transmission line (the non-linear channel) includes an amplifier 14 generating non-linear distortion of similar amplitude to that produced by the power amplifier to be linearized, a variable attenuator 13 and a variable phase-shifter 29.

The second transmission line (the linear channel) includes a variable phase-shifter 19, a variable attenuator 13 and a microwave amplifier 4.

The signals on the two channels are then added by a coupler (power combiner) 15 one branch of which is terminated by a matched load 7. The predistortion correction signal is supplied from the output 6 of the coupler (power combiner) 15 to a microwave power amplifier (not shown). The coupler (power combiner) 15 conventionally introduces a phase-shift θ between the two signals supplied to its inputs from the two transmission lines, before they are added together. The coupler 15 can be a 3 dB hybrid coupler, for example, which introduces a phase-shift θ=π/2 (=90°). In a preferred embodiment of the invention the coupler 15 can be a ring coupler, also capable of introducing the required phase-shift.

In addition to the essential components of the invention referred to above, other components can be introduced into each channel, provided that the electrical lengths of the components introduced into each channel are identical and provided that any variations in their characteristics (transfer functions) as a function of temperature or operating conditions (input signal power, frequency) in particular are the same.

In a preferred embodiment of the invention each channel further includes a fixed attenuator (not shown in FIG. 2). These fixed attenuators can have different attenuation values but their electrical lengths are the same. In this way, the electrical lengths of all the circuits of each channel being identical, the linearizer device of the invention operates correctly over a very wide band of frequencies, since the transfer function of each channel varies with frequency in the same manner.

The design described above with reference to FIG. 2 therefore features an inherent phase-shift of 180° between the two channels, this total phase-shift resulting entirely from the phase-shifts introduced by the coupler (power divider) 22 and the coupler (power combiner) 15. As the circuits on the two channels are identical and the settings of the identical circuits are approximately the same in both channels, any variations with temperature of the transfer functions of the two channels are added with opposite phase and cancel out. The device of the invention is therefore automatically temperature compensated.

Because the electrical lengths of the two channels are identical, the transfer function of the device of the invention is independent of frequency. The device operates correctly over a very wide band of frequencies.

The person skilled in the art knows that the relative phase-shift $\Delta\phi$ of the signals on the linear channel and the non-linear channel to obtain a global transfer function of the linearizer corresponding to a TWT microwave power amplifier is always in the order of $\Delta\phi=-170°$, with an amplitude difference $\Delta V$ on the two channels in the order of 3 dB. For a solid state microwave amplifier, on the other hand, the relative phase-shift of the signals on the two channels is in the order of $\Delta\phi=+170°$. In both cases the inherent phase-shift of 180° between the two channels "presets" the linearizer of the invention, which saves time in the fine adjustment of the variable phase-shifters of the linearizer and ensures that the two variable phase-shifters are set to similar values, and therefore to nearby operating points, the latter obtained by component bias values which are virtually the same. This maintains identical electrical lengths in both channels.

In a preferred embodiment of the invention fixed attenuators are added to each channel. In the previously mentioned application of linearizing a solid state or TWT microwave power amplifier the fixed attenuator in the non-linear channel must be set to an attenuation value 3 dB greater than the attenuation value of the fixed attenuator in the linear channel. In this way, if small amplitude adjustments are required in one of the two channels, this can be done without significant modification to the operating point and therefore without significant modification to the electrical lengths of the two channels.

In this embodiment the two channels are inherently set very close to the optimum point defined by $\Delta\phi=\pm170°$, $\Delta V=3$ dB. Final adjustment of the phase difference or the amplitude difference between the signals in the linear and non-linear channels is then effected by means of attenuator or phase-shifter circuits in each of the two channels. The fact that the inherent amplitudes and phases of the signals propagating in the two channels are very close to the optimum setting means that the biasing conditions of the fine adjustments circuits (attenuators and phase-shifters) will be similar. Their transfer functions will remain virtually identical because any adjustment required will necessarily be a small adjustment from this inherent setting of $\Delta\phi=180°$, $\Delta V=3$ dB.

Tests have been carried out to verify the effectiveness and the correct operation of the device of the invention. In these tests the linearizer described was associated with a TWT for which at saturation the required gain expansion was 4 dB and the required phase expansion was 40°. It was found that the linearizer was inherently near the required setting and that fine adjustment could be completed very quickly. It was also found that the linearizer of the invention operated perfectly over a wide band of frequencies without any change of setting. A first breadboard implementation had a bandwidth in the C band of 20%.

The variation in the gain expansion curve of the linearizer was found to be negligible and the variation in the phase expansion curve was found to be very small (less than 5° at saturation) for a range of temperature from $-10°$ C. to $+60°$ C.

The circuits of the two channels of the linearizer device of the invention can be implemented in techniques familiar to the person skilled in the art, in particular in the MMIC or MIC technology. The circuits can be implemented collectively or individually, and then interconnected by microstrip circuits, or by hybrid techniques. The device of the invention lends itself naturally to implementation in the MMIC technology in that the circuits of each channel must be identical and can be easily reproduced from a library of standard MMIC components.

Finally, the linearizer device of the invention is intended to form part of a microwave power amplifier the linearity of which it improves over a wide band of frequencies and under varying operating conditions. The invention also provides a microwave amplifier including a linearizer as described hereinabove.

To summarize the advantages of the invention, the proposed predistortion linearizer device comprises linear and non-linear channels made up of the same components for which the bias conditions and the operating points are identical or virtually identical. As a result the global transfer function of the device is not affected by variations in the temperature of the device, or at worst is only very slightly affected. The device of the invention can be regarded as automatically temperature compensated.

Also, because the electrical lengths of the paths are identical or virtually identical, the device operates in a very wide band of frequencies.

Further, the novel use of a branch-line coupler at the input and a ring coupler at the output associated with the fact that the two channels are constructed from the same devices means that the device of the invention has an inherent phase (and, in one specific embodiment, an inherent amplitude) corresponding to a TWT or solid state amplifier application. The device of the invention is therefore "preset".

Of course, the invention is not limited to the examples discussed and described above, but can be applied to any implementation using one or more means equivalent to the means described by way of example to implement the same functions to obtain the same results.

There is claimed:

1. A predistortion linearizer for microwave amplifiers including:

an input power divider having one input and two outputs with a relative phase-shift of 90° between said two outputs;

a linear channel and a non-linear channel, said linear and non-linear channels having substantially the same electrical length and comprising identical circuit elements; and an output power combiner having two inputs and one output with a relative phase-shift of 90° between said two inputs.

2. Linearizer according to claim 1 wherein said power divider is a 3 dB hybrid coupler.

3. Linearizer according to claim 1 wherein said power combiner is a 3 dB hybrid coupler.

4. Linearizer according to claim 1 wherein said power divider is a branch-line coupler.

5. Linearizer according to claim 1 wherein said power combiner is a ring coupler.

6. Linearizer according to claim 1 at least part of which is implemented in MMIC technology.

7. Linearizer according to claim 1 at least part of which is implemented in MIC technology.

8. A microwave amplifier comprising:

a predistortion linearizer including: an input power divider having one input and two outputs with a relative phase-shift of 90° between said two outputs; a linear channel and a non-linear channel, said linear and non-linear channels having substantially the same electrical length and comprising identical circuit elements; and an output power combiner having two inputs and one output with a relative phase-shift of 90° between said two inputs; and a power amplifier connected to the output of the output power combiner.

9. The linearizer according to claim 1, wherein the output of the output power combiner is connected to an input of a microwave power amplifier.

10. The linearizer according to claim 1, wherein the identical circuit elements of the linear and non-linear channels include:

a microwave amplifier;

a variable attenuator; and a variable phase shifter.

11. The linearizer according to claim 10, wherein the identical circuit elements of the linear and non-linear channels further include a fixed attenuator.

* * * * *